United States Patent
Tashiro et al.

(10) Patent No.: US 10,246,796 B2
(45) Date of Patent: Apr. 2, 2019

(54) $RAMO_4$ SUBSTRATE

(71) Applicant: Panasonic Intellectual Property Management Co., Ltd., Osaka (JP)

(72) Inventors: Isao Tashiro, Osaka (JP); Hidenao Kataoka, Osaka (JP); Yoshio Okayama, Osaka (JP); Nobuyuki Yokoyama, Osaka (JP); Yoshifumi Takasu, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 178 days.

(21) Appl. No.: 15/429,164

(22) Filed: Feb. 10, 2017

(65) Prior Publication Data
US 2017/0275778 A1    Sep. 28, 2017

(30) Foreign Application Priority Data

Mar. 25, 2016  (JP) .................. 2016-061044
Nov. 1, 2016   (JP) .................. 2016-214484

(51) Int. Cl.
C01F 17/00    (2006.01)
C30B 29/22    (2006.01)

(52) U.S. Cl.
CPC .......... *C30B 29/22* (2013.01); *C01F 17/0025* (2013.01)

(58) Field of Classification Search
CPC ..... C30B 29/22; C30B 29/26; Y10T 428/195; Y10T 428/24777; C01F 17/0025
See application file for complete search history.

(56) References Cited

U.S. PATENT DOCUMENTS 5,751,055 A * 5/1998 Maruyama ........ H01L 21/02381
117/902

FOREIGN PATENT DOCUMENTS

| JP | 2000-331940 A | 11/2000 |
| JP | 2006-147891 A | 6/2006 |
| JP | 2015-178448   | 10/2015 |
| JP | 2015-225902 A | 12/2015 |

* cited by examiner

Primary Examiner — Catherine A. Simone
(74) Attorney, Agent, or Firm — McDermott Will & Emery LLP

(57) ABSTRACT

A $RAMO_4$ substrate containing an $RAMO_4$ base material part containing a single crystal represented by the general formula $RAMO_4$ (wherein R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd), the $RAMO_4$ base material part having a beveled portion at an edge portion thereof.

5 Claims, 5 Drawing Sheets

RAMO₄ SUBSTRATE

TECHNICAL FIELD

The technical field relates to an $RAMO_4$ substrate.

BACKGROUND

A $ScAlMgO_4$ substrate has been used as a substrate for epitaxial growth of a nitride semiconductor, such as GaN (see, for example, Patent Literature 1). FIG. 5 is a diagram showing an example of the method for producing an ordinary $ScAlMgO_4$ substrate described in Patent Literature 1. As shown in FIG. 5, the ordinary $ScAlMgO_4$ substrate has been produced by cleaving an $ScAlMgO_4$ bulk material.

Patent Literature 1: JP-A-2015-178448

As shown in Patent Literature 1, $ScAlMgO_4$ having cleavage property can be easily formed into a substrate by utilizing the cleavage property thereof, but the cleavage property may affect the robustness of the substrate. For example, in the production of a wafer or a device from an $ScAlMgO_4$ substrate, chipping and cracking may occur at the edge portion of the substrate in some cases, which can affect the yield and the like. Under these circumstances, there has been a demand of a substrate having high robustness.

SUMMARY as According to one aspect, an substrate contains an $RAMO_4$ base material part containing a single crystal represented by the general formula $RAMO_4$ (wherein R represents one or a plurality of trivalent elements selected from a group of elements including: Sc, In, Y, and a lanthanoid element, A represents one or a plurality of trivalent elements selected from, a group of elements including: Fe (III), Ga, and Al, and M represents one or a plurality of divalent elements selected from a group of elements including: Mg, Mn, Fe(II), Co, Cu, Zn, and Cd), the $RAMO_4$ base material part having a beveled portion at an edge portion thereof.

Accordingly, an $RAMO_4$ substrate having high robustness can be provided.

DESCRIPTION OF EMBODIMENTS

Embodiments will be described below with reference to the drawings. In the embodiments, an $ScAlMgO_4$ substrate will be described for the $RAMO_4$ substrate. In the embodiments, the $ScAlMgO_4$ substrate may refer to the the $ScAlMgO_4$ base material part in some cases.

Embodiment 1

Firstly, the knowledge, with which the embodiments have been achieved, is described. The $ScAlMgO_4$ single crystal has a structure containing an $ScO_2$ layer like the (111) plane of the rock salt structure and an $AlMgO_2$ layer like the (0001) plane of the hexagonal structure, which are laminated alternately. The two layers like the (0001) plane of the hexagonal structure are of a planar structure as compared to the wurtzite structure, and the bond between the upper and lower layers is longer than the bond in the plane by approximately 0.03 nm, and has a weak bond strength. Accordingly, the $ScAlMgO_4$ single crystal can be cleaved at the (0001) plane. By utilizing these characteristics, a bulk material can be divided through cleavage, and thereby a step of preparing a plate state (i.e., a cleaving step) can be performed.

Figure 6:
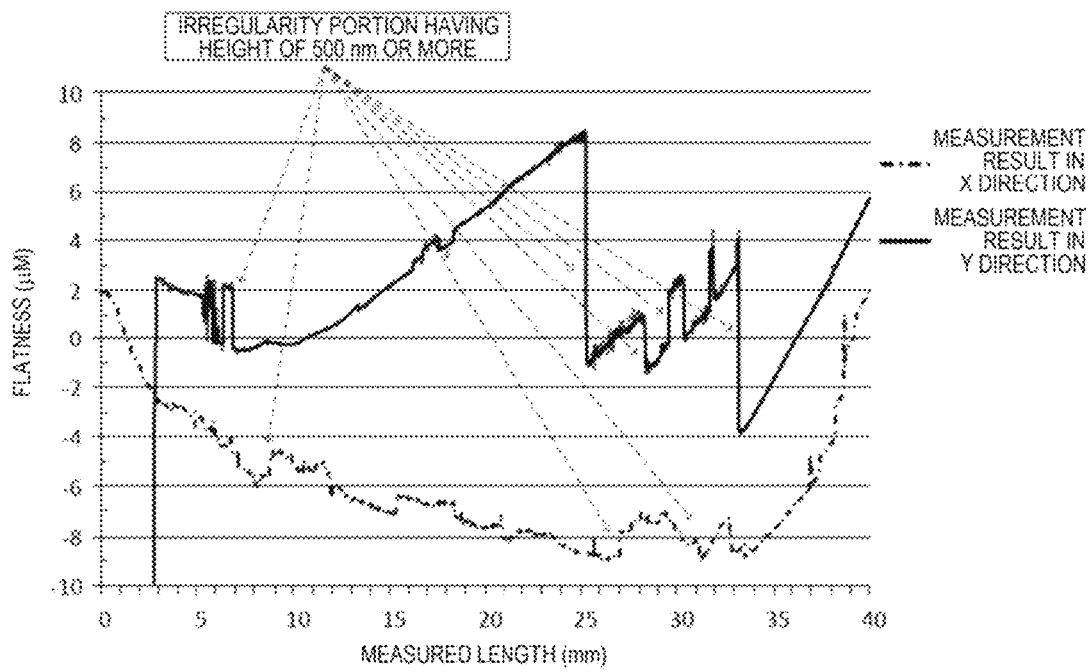
FIG. 6 is a graph showing the measurement result of the flatness of the ordinary epitaxial growth surface formed only by cleavage.

However, the property of the $ScAlMgO_4$ single crystal relating to cleavage makes difficult the processing of the cleavage surface by the ordinary processing method although the property facilitates the cleaving step, i.e., the step of forming an $ScAlMgO_4$ substrate from an $ScAlMgO_4$ ingot through cleavage. FIG. 6 shows the measurement data of the flatness of the cleavage surface (which may be hereinafter referred to as an "epitaxial growth surface") after cleaving an $ScAlMgO_4$ bulk material. The data are obtained with a laser reflection length measurement equipment (NH-3MA, produced by Mitaka Kohki Co., Ltd.) in the XY axes perpendicular to each other in one plane of the $ScAlMgO_4$ substrate having a diameter of 40 mm. As shown by the arrows in FIG. 6, the cleavage surface obtained by cleaving the bulk material has irregularity portions having steps of 500 nm or more. In the production of the $ScAlMgO_4$ substrate, it is considered that due to the fluctuation of the cleaving force in the cleavage direction on cleaving, the cleavage does not occur in the same atomic layer, thus irregularity portions having steps of 500 nm or more are consequently formed.

The epitaxial growth of the $ScAlMgO_4$ single crystal on the (0001) plane (i.e., the cleavage surface of the $ScAlMgO_4$ substrate) is then described. The epitaxial growth surface may be constituted by a sole (0001) plane (cleavage surface). However, when the epitaxial growth surface has a part to be a seed of accidental crystal growth, such as a defect and a foreign matter, present thereon, Ga atoms may be concentrated to the seed of accidental crystal growth in the vapor phase epitaxial growth of GaN, for example by an MOCVD method, thereby causing local heterogeneous growth in some cases.

There is thus a demand of flattening the epitaxial growth surface of the $ScAlMgO_4$ substrate obtained by the cleaving step. However, it is not easy to remove the irregularities of 500 nm or more formed on the cleavage surface as described above. In particular, the processing of the cleavage surface of the $ScAlMgO_4$ substrate encounters the following difficulty. In the case where the irregularities formed through cleavage are tried to be removed, when the proportion of the flat portion in the entire surface is large, the processing force tends to be concentrated to a partial area (irregularity) on processing the flat portion. Cracks due to cleavage may occur deep in the interior from the surface, but not on the surface. It is considered that irregularities are newly formed due to removal of the cracked portions. When the proportion of the flat portion is large, the application of a force that does not cause cleavage in the interior substantially cannot remove the irregularities formed in the cleaving step.

Figure 8:
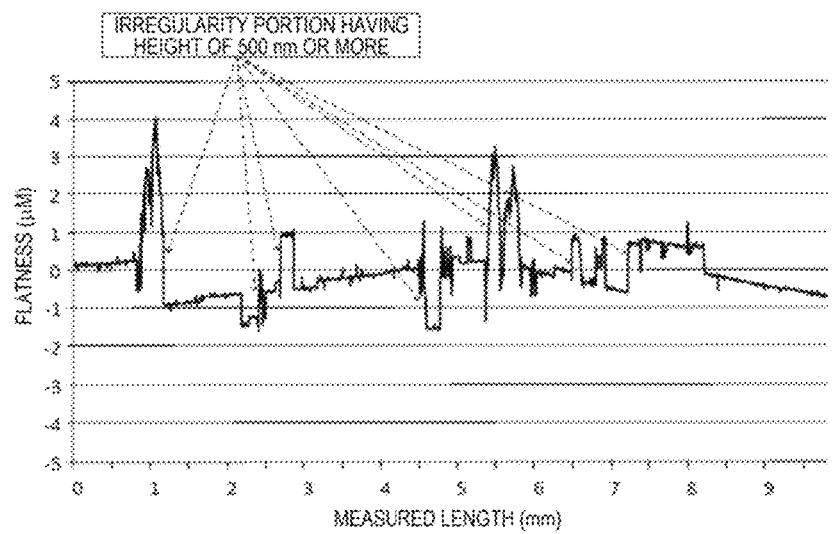
FIG. 8 is a graph showing the measurement result of the flatness of the cleavage surface of $ScAlMgO_4$ polished with a 2 µm diamond slurry.

A $ScAlMgO_4$ substrate having a cleavage surface (epitaxial growth surface) that is flattened by the ordinary processing method is described. FIG. 8 shows the result of lap polishing of a cleavage surface of $ScAlMgO_4$ with a diamond slurry having a diameter of 2 µm (abrasive grains), which is generally used for coarse polishing. FIG. 8 shows the result of measurement of the flatness of the processed surface in the X direction. As shown in FIG. 8, it is understood that irregularities of 500 nm or more are formed on the surface by performing the processing. In the lap polishing, a diamond slurry is rotated on the surface of $ScAlMgO_4$, and the material where the slurry is rotated is minutely removed thereby. However, it is considered that since a single crystal of $ScAlMgO_4$ is a laminated material of many $SiO_2$ layers and $AlMgO_2$ layers, the deeper layers are partially released off due to the fluctuation of the processing force. It is thus considered that irregularities of 500 nm or more are formed as shown in FIG. 8. Consequently, the cleavage property of $ScAlMgO_4$ is quite effective for dividing an ingot into thick substrates through the cleavage phenomenon, but in a microscopic view, the aforementioned irregularities are formed, and the substrate tends to be cleaved with an external force. Accordingly, it can be said that the cleavage property influences the state and the shape on the surface of the substrate.

Figure 7A:
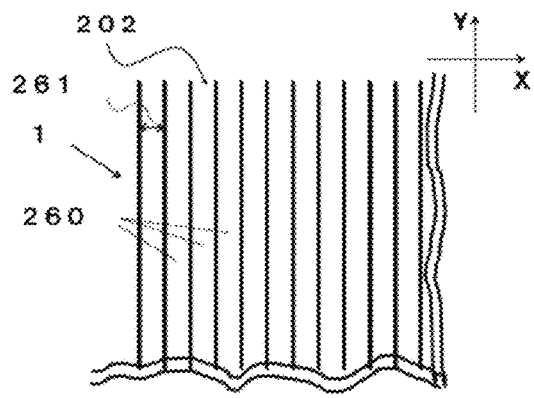
FIG. 7A is a plan view showing an epitaxial growth surface having plural cleavage surfaces of an $ScAlMgO_4$ substrate of the embodiment.
Figure 7B:
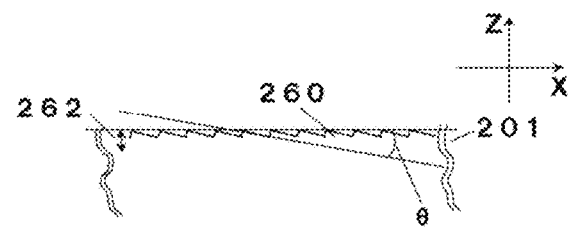
FIG. 7B is a side view of the $ScAlMgO_4$ substrate.

In view of the aforementioned phenomenon, as a result of earnest investigations, it has been found that cleavage surfaces that are separated from each other with steps can be formed on an $ScAlMgO_4$ substrate by performing a special processing method. The $ScAlMgO_4$ substrate obtained by the processing method has plural cleavage surfaces (which may be hereinafter referred to as "minute flat surfaces") 260 on the epitaxial growth surface 202 as shown in FIGS. 7A and 7B. The epitaxial growth surface 202 does not have irregularities of 500 nm or more.

Specifically, the processing method described in detail below (i.e., the coarse irregularity forming step and the minute irregularity forming step) has been found, and designated as the irregularity removing step of the embodiment. Specifically, an irregularity shape having a uniform height is formed over the entire surface of the region to be an epitaxial growth surface of the $ScAlMgO_4$ substrate (i.e., the coarse irregularity forming step). Subsequently, the irregularity shape having a uniform height having been formed on the entire surface is gradually reduced, while the pressing force is reduced stepwise to decrease the absolute value of the fluctuation of the pressing force, thereby preventing the cleavage in the interior (i.e., the minute irregularity forming step).

In the coarse irregularity forming step, the irregularity shape is distributed over the entire surface of the region to be an epitaxial growth surface in such a manner that the areas of the regions each having continuously a height of the irregularities of 500 nm or less (which may be hereinafter referred to as a "flat portion") each are 1 $mm^2$ or less. This is because when the flat portion having an area exceeding 1 $mm^2$ is formed in the coarse irregularity forming step, the cleavage in the interior occurs in the minute irregularity forming step due to the processing force concentration, forming irregularities having a height exceeding 500 nm. The difference among the heights of the plural protruded parts of the irregularities formed in the coarse irregularity forming step is preferably within a range of ±0.5 µm. When the irregularities having a uniform height, which have the fluctuation in height within the range, are formed over the entire surface, the height of the irregularities can be gradually reduced in the minute irregularity forming step, and thereby a uniform flat portion can be formed on the surface.

Specifically, in the coarse irregularity forming step, irregularities having a height of 500 nm or more are formed with first abrasive grains, and in the minute irregularity forming step, irregularities having a height of less than 500 nm are formed with second abrasive grains having a hardness that is smaller than that of the first abrasive grains.

More specifically, in the irregularity forming step of processing an irregularity shape having a uniform height, a grinding process is performed with a diamond fixed whetstone having a large abrasive grain size. As for the abrasive grain size, diamond abrasive grains of #300 or more and #20000 or less (preferably #600) may be used. By the process using the diamond abrasive grains having a size within the range, the difference in height of the irregularities on the processed surface can be made within a range of ±5 µm. The processing conditions in the coarse irregularity forming step may be a rotation number of the whetstone of 500 $min^{-1}$ or more and 50,000 $min^{-1}$ or less (preferably 1,800 $min^{-1}$), a rotation number of the $ScAlMgO_4$ substrate of 10 $min^{-1}$ or more and 300 $min^{-1}$ or less (preferably 100 $min^{-1}$), a processing speed of 0.01 µm/sec or more and 1 µm/sec or less (preferably 0.3 µm/sec), and a processing elimination amount of 1 µm or more and 300 µm or less (preferably 20 µm). For example, as a result of processing with a diamond whetstone of #600 under conditions of a rotation number of the whetstone of 1,800 $min^{-1}$, a rotation number of the $ScAlMgO_4$ substrate of 100 $min^{-1}$, a processing speed of 0.3 µm/sec, and a processing elimination amount of 20 µm, the region to be an epitaxial growth surface does not have 1 $mm^2$ or more of the flat portion (i.e., 1 $mm^2$ or more of the region having continuously a height of the irregularities of 500 nm or less), but has a well-regulated irregularity shape can be formed.

The minute irregularity forming step of gradually removing the irregularities formed in the coarse irregularity forming step is then described. In the minute irregularity forming step, while the irregularities having a height of 500 nm are removed, irregularities having a height of less than 500 nm are formed by polishing with a pressing force that is reduced stepwise. In the minute irregularity forming step, a slurry containing colloidal silica as a major component is preferably used as abrasive grains, and polishing is preferably performed with a nonwoven cloth pad as a polishing pad at a rotation number of 10 $min^{-1}$ or more and 1,000 $min^{-1}$ or less (preferably 60 $min^{-1}$) and a slurry supplying amount of 0.02 mL/min or more and 2 mL/min or less (preferably 0.5 mL/min). The slurry supplying amount may be changed depending on the area of the substrate. Specifically, the slurry supplying amount is preferably increased when the area of the substrate is larger. In the case where a large amount of irregularities is formed, the processing force tends to be concentrated on the protruded parts thereof. Accordingly, the pressing force is preferably in a range of 10,000 Pa or more and 20,000 Pa or less in the initial stage of the minute irregularity forming step, then in a range of 5,000 Pa or more and less than 10,000 Pa when the protruded parts are being flattened, and finally in a range of 1,000 Pa or more and 5,000 Pa or less. By decreasing the pressing force stepwise in this manner, the irregularities having a height of 500 nm or more can be removed from the region to be an epitaxial growth surface while preventing the cleavage in the interior from occurring.

The result obtained by actually performing polishing initially at a pressing force of 15,000 Pa for 3 minutes, then polishing at a pressing force reduced to 8,000 Pa for 5 minutes, and finally polishing at a pressing force reduced to 1,000 Pa for 10 minutes is shown below. As a result of the measurement of the surface shape with an AFM (atomic force microscope) for an area of 10 μm square on the epitaxial growth surface, there is no irregularity having a height of 500 nm or more in the 10 μm square area, and the maximum height Rmax is 6.42 nm. Thus, irregularities having a height of 50 nm or more are not found. The root mean square roughness Rq is 0.179 nm. As a result of the more detailed shape analysis of the epitaxial growth surface, in the minute area of 100 μm$^2$, the surface roughness Ra is 0.139 nm, and an extremely smooth surface having no irregularity of 50 nm or more can be formed. The surface roughness Ra of the epitaxial growth surface obtained herein is 0.08 nm or more and 0.5 nm or less. The surface roughness Ra and the like are measured according to ISO 13565-1 with Dimension Icon, produced by Bruker Corporation.

According to the processing method described above (i.e., the coarse irregularity forming step and the minute irregularity forming step), an ScAlMgO$_4$ substrate having an epitaxial growth surface containing cleavage surfaces that are separated from each other with steps is prepared.

The structure of the ScAlMgO$_4$ substrate 1 prepared by the aforementioned special processing method is more it specifically described. As shown in FIGS. 7A and 7B, the ScAlMgO$_4$ substrate 1 has an epitaxial growth surface 202 having plural minute flat surfaces 260. FIG. 7A is a plan view of a part of the epitaxial growth surface 202 of the ScAlMgO$_4$ substrate, and FIG. 7B is a schematic view of the ScAlMgO$_4$ substrate viewed from the side surface. As in FIG. 7A, in the ScAlMgO$_4$ substrate, the epitaxial growth surface 202 is constituted by the plural minute flat surfaces 260. The minute flat surfaces 260 each have an elongated shape, and are regularly aligned in parallel to each other. In this embodiment, the width of the minute flat surface 260 in the X direction is designated as a minute flat surface width 261, and the height of the step between the minute flat surfaces adjacent to each other is designated as a minute flat surface height 262.

In the ScAlMgO$_4$ substrate 1, the principal surface of the ScAlMgO$_4$ substrate 1 has an off angle θ with respect to the minute flat surface 260 (i.e., the cleavage surface). The principal surface of the ScAlMgO$_4$ substrate 1 in this embodiment is the surface of the epitaxial growth surface 202 of the ScAlMgO$_4$ substrate 1 in the macroscopic observation. The surface of the epitaxial growth surface 202 of the ScAlMgO$_4$ substrate 1 of the embodiment is flat in the macroscopic view, and the principal surface of the ScAlMgO$_4$ substrate 1 can be a flat surface including the ridge lines on the front surface side of the plural minute flat surfaces (i.e., the cleavage surfaces) 260. The off angle θ in the embodiment is the angle formed between the principal surface of the ScAlMgO$_4$ substrate 1 and the minute flat surfaces (i.e., the cleavage surfaces) 260 separated from each other. Accordingly, the plane direction of the principal surface of the epitaxial growth surface 202 is tilted by θ with respect to the cleavage surface of ScAlMgO$_4$. The off angle θ can also be referred to as the angle formed between the principal surface of the ScAlMgO$_4$ substrate 1 and the (0001) plane of ScAlMgO$_4$.

In the case where a polar surface, such as a c-plane of a Group III nitride, is grown on the ScAlMgO$_4$ substrate 1 (i.e., the ScAlMgO$_4$ base material part) as the seed substrate, the off angle θ is also the angle formed between the principal surface of the seed substrate (i.e., the ScAlMgO$_4$ substrate 1) and the polar surface, such as the c-plane, of the epitaxial growth surface. While the surface that has an off angle with respect to the principal surface of the seed substrate, i.e., the minute flat surface 260, is described as the c-plane (i.e., the polar surface) of a single crystal of ScAlMgO$_4$, the meaning of the off angle is the same as in the case where the minute flat surface 260 is the m-plane (i.e., a non-polar surface) of a single crystal of ScAlMgO$_4$, and the case where the minute flat surface 260 is the a-plane (i.e., a semi-polar surface) of a single crystal of ScAlMgO$_4$. The ScAlMgO$_4$ substrate 1 provided with the off angle has the plural minute flat surfaces 260 aligned continuously in a staircase pattern in the microscopic view as shown in FIG. 7B.

The shape of the edge portion of the ScAlMgO$_4$ substrate is then described. In the ScAlMgO$_4$ substrate having the epitaxial growth surface, the easiness of cleavage influences the edge shape of the substrate. The edge shape means the shape of the edge portion of the ScAlMgO$_4$ substrate, i.e., the shape of the substrate in the peripheral portion that is outside the epitaxial growth surface 202. In the embodiment, the edge portion is formed to provide an angle with respect to the ScAlMgO$_4$ substrate, and is referred to as a beveled portion. The edge shape is provided for such purposes as the prevention of chipping and cracking in the production of a wafer or a device, the prevention of a crown, which is an annular protrusion formed due to abnormal growth on the peripheral portion in the epitaxial growth, and the like. The purposes may also include the discrimination of the front and back surfaces. However, when the beveled, portion has a shape that induces cleavage, there may be problems that the shape thereof is changed by the cleavage, and the cleavage in the beveled portion extends to the epitaxial growth surface to reduce the effective area of the epitaxial growth surface. In the embodiment, accordingly, the beveled portion that has the shape described below is provided, and thereby the robustness of an ScAlMgO$_4$ substrate (i.e., an RAMO$_4$ substrate) having cleavage property to prevent the breakage thereof.

Figure 1:
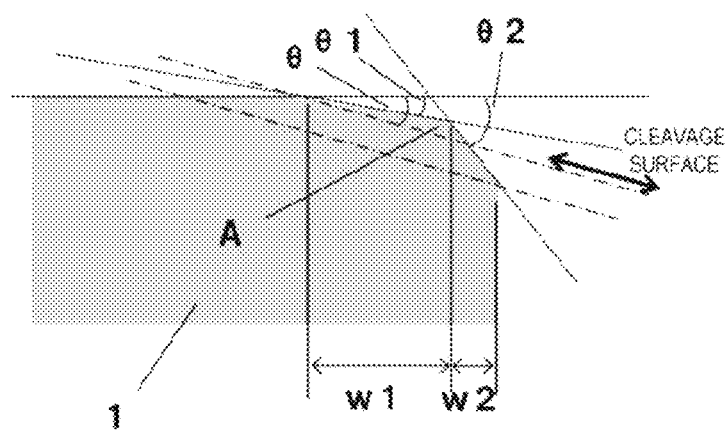
FIG. 1 is a cross sectional view showing the beveled portion in the embodiment 1.

FIG. 1 shows the shape of the beveled portion, provided on the outer periphery outside the epitaxial growth surface of the ScAlMgO$_4$ substrate 1 (base material part) in the embodiment 1. The beveled portion contains a first region having a surface that forms an angle θ1 with respect to the principal surface of the ScAlMgO$_4$ substrate 1, and a second region positioned outside the first region, having a surface that forms an angle θ2 with respect to the principal surface of the ScAlMgO$_4$ substrate 1. The first region and the second region are different from each other in the angle of the bevel (i.e., the tilt angle with respect to the principal surface of the ScAlMgO$_4$ substrate 1), and an inflection point A is present between the regions. In FIG. 1, w1 shows the distance from the starting point of the first region to the inflection point A where the angle is changed in the beveled portion, and w2 shows the distance from the inflection point A to the end point of the second region, i.e., the side surface of the substrate 1. More accurately, w1 shows the length of the first region in the direction in parallel to the principal surface of the ScAlMgO$_4$ substrate 1, and w2 shows the length of the second region in the direction in parallel to the principal surface of the ScAlMgO$_4$ substrate 1.

In FIG. 1, θ shows the off angle of the ScAlMgO$_4$ substrate 1. The off angle is the angle formed between the principal surface of the ScAlMgO$_4$ substrate 1 and the cleavage surface of the ScAlMgO$_4$ on the epitaxial growth surface as described above. θ1 shows the angle formed between the principal surface of the ScAlMgO$_4$ substrate 1 and the surface of the first region, and θ2 shows the angle formed between the principal surface of the ScAlMgO$_4$ substrate 1 and the surface of the second region. More accurately, the angles (θ1 and θ2) formed between the regions of the beveled portion and the principal surface of the ScAlMgO$_4$ substrate 1 are the angles formed between the plane in parallel to the principal surface and the surfaces of the regions. The angles of the regions in the beveled portion can be obtained from the cross sectional shape or the like of the ScAlMgO$_4$ substrate.

In the case where the principal surface of the ScAlMgO$_4$ substrate 1 has an off angle θ as in this embodiment, the beveled portion preferably has a first region having an angle θ1 with respect to the principal surface that is smaller than the off angle θ, and a second region having an angle θ2 with respect to the principal surface that is larger than the off angle θ. Thus the angles θ, θ1, and θ2 preferably satisfy the relationship θ1<θ<θ2. When the beveled portion has the first region and the second region formed therein, cleavage in the beveled portion can be further prevented from occurring, and the robustness of the ScAlMgO$_4$ substrate can be improved. The reason of the phenomenon is described below.

Figure 2A:
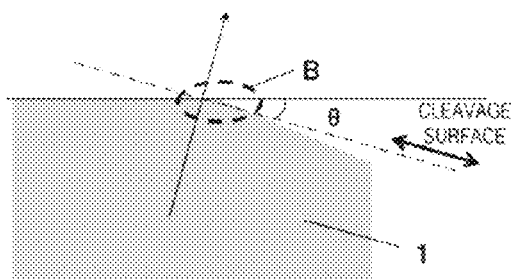
FIGS. 2A and 2B each are a cross sectional view showing exemplary beveled portions.
Figure 2B:
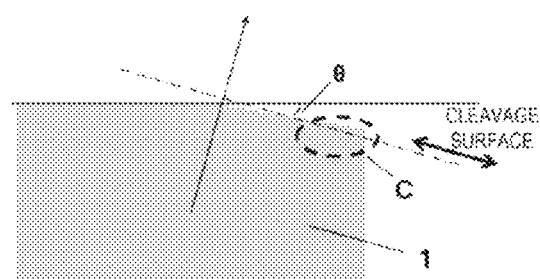

The case where the off angle θ is 14 deg or more, and the shape of the beveled portion is a linear shape that does not have an inflection point A (i.e., a point where the angle is changed) is described with reference to FIGS. 2A and 2B. FIG. 2A shows the case where the angle formed between the surface of the beveled portion and the principal surface of the ScAlMgO$_4$ substrate 1 is larger than the off angle θ. In this case, in the application of a force on the surface of the beveled portion, there are cases where the surface of the beveled portion (which may be hereinafter referred to as a "bevel surface") is broken in the cleavage direction in the inner peripheral region of the beveled portion (i.e., the region B in FIG. 2A) since ScAlMgO$_4$ is very easily cleaved. FIG. 2B shows the case where the angle formed between the surface of the beveled portion and the principal surface of the ScAlMgO$_4$ substrate 1 is smaller than the off angle θ. In this case, in the application of a force on the surface of the beveled portion, there are cases where the bevel surface is broken in the cleavage direction in the outer peripheral region of the beveled portion (i.e., the region C in FIG. 2B).

Figure 3A:
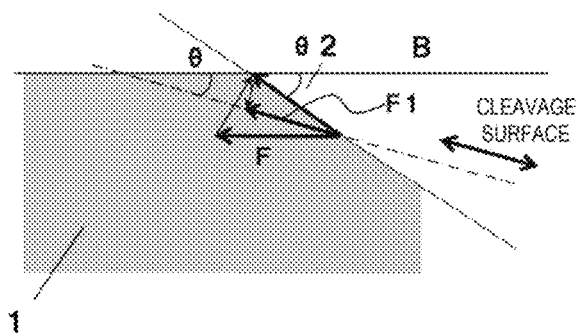
FIGS. 3A and 3B each are an illustration showing the processing force in bevel polishing, and FIGS. 3C and 3D each are an illustration showing the relationship between the shape of the beveled portion and the easiness of cleavage.

The force formed in the formation of the beveled portion and the easiness of cleavage of the beveled portion are described with reference to FIGS. 3A to 3D. FIG. 3A is an illustration showing the force formed in the formation of the beveled portion in the case where the surface of the beveled portion to be formed forms an angle θ2 with respect to the principal surface of the ScAlMgO$_4$ substrate 1. It is assumed that the angle θ2 is larger than the off angle θ. The beveled portion may be formed with a polishing whetstone, a polishing tape, or the like as described later, and in any of the methods, a processing force F in the horizontal direction is applied to the surface, on which the beveled portion is to be formed, as shown in FIG. 3A. A force F·cos θ2 is applied to the bevel surface. The component force F1 in the cleavage direction applied to the bevel surface can be shown by the following expression (1).

$$F1 = F \cdot \cos θ2 \cdot \cos(θ2-θ) \quad (1)$$

Accordingly, assuming that the most cleavable direction is the cleavage direction, the cleavage becomes difficult to occur when the angle of the bevel surface to be formed with respect to the cleavage surface becomes larger. That is, when the angle θ2 becomes larger, F1 in the expression (1) becomes smaller, thereby making the cleavage difficult. The difficulty of the cleavage can be expressed by sin(2×(45deg-(θ2-θ)) assuming the similar characteristics as in the shearing force. Consequently, the easiness of cleavage can be shown by the following expression (2).

$$\text{(Easiness of cleavage)} = \cos θ2 \cdot \cos(θ2-θ) \cdot \sin(2 \times (45\text{deg}-(θ2-θ))) \quad (2)$$

Figure 3B:
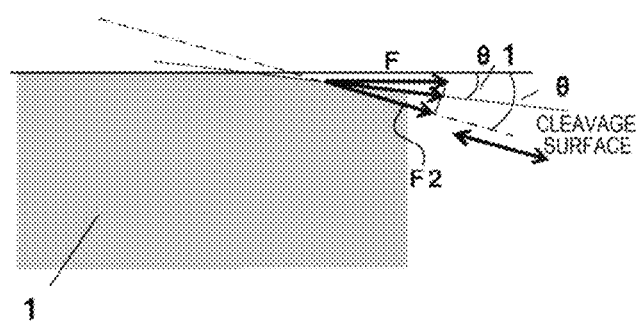

On the other hand, FIG. 3B is an illustration showing the shape of the beveled portion in the case where θ is larger than θ1. A processing force F in the horizontal direction is applied to the surface, on which the beveled portion is to be formed, as shown in FIG. 3B. A force F·cos θ1 is applied to the bevel surface. The component force F2 in the cleavage direction applied to the bevel surface can be shown by the following expression (3).

$$F2 = F \cdot \cos θ1 \cdot \cos(θ-θ1) \quad (3)$$

Assuming that the most cleavable direction is the cleavage direction, the cleavage becomes difficult to occur when the angle of the bevel surface to be formed with respect to the cleavage surface becomes larger. The difficulty of the cleavage can be expressed by sin(2×(45deg-(θ-θ1))) assuming the similar characteristics as in the shearing force. Consequently, the easiness of cleavage can be shown by the following expression (4).

$$\text{(Easiness of cleavage)} = \cos θ1 \cdot \cos(θ-θ1) \cdot \sin(2 \times (45\text{deg}-(θ-θ1))) \quad (4)$$

Figure 3C:
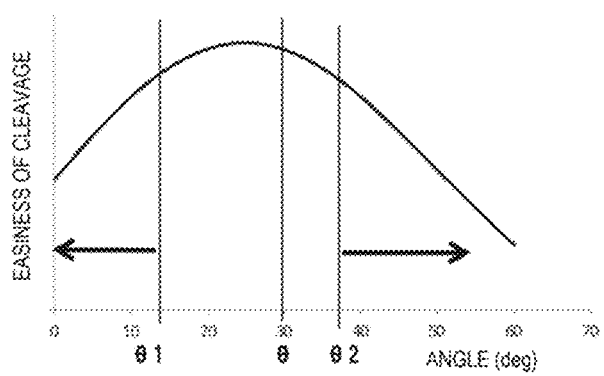
Figure 3D:
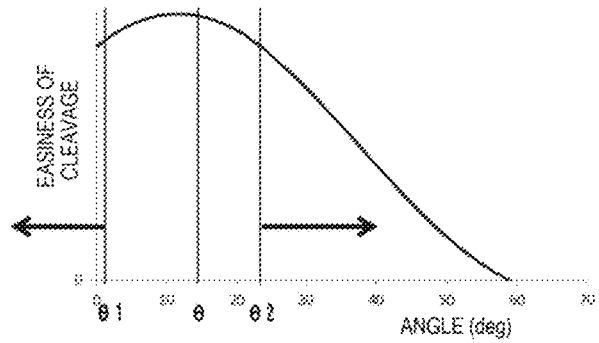

FIGS. 3C and 3D each are an illustration showing the easiness of cleavage drawn based on the expressions (2) and (4). FIG. 3C is an illustration in the case where the off angle θ is 30 deg, and FIG. 3D is an illustration in the case where the off angle θ is 14 deg. In these illustrations, a larger value means that the cleavage more easily occurs in the beveled portion.

As shown in FIGS. 3C and 3D, the cleavage becomes difficult to occur in the beveled portion when θ1 is smaller or when θ2 is larger. Therefore, an ScAlMgO$_4$ substrate having a beveled portion that is difficult to be cleaved and having ensured strength can be achieved in such a manner that the first region (i.e., the region having an angle θ1 with respect to the principal surface of the ScAlMgO$_4$ substrate 1) and the second region (i.e., the region having an angle θ2 with respect to the principal surface of the ScAlMgO$_4$ substrate 1) are formed in the beveled portion, and the angles θ1 and θ2 are appropriately set.

In FIGS. 3C and 3D, with respect to the easiness of cleavage at the off angle θ (which is 30 deg or 14 deg), the angles where the easiness of cleavage is reduced by 10% are designated as θ1 and θ2. Specifically, in the case shown in FIG. 3C, θ1 can be 13 deg, and θ2 can be 37 deg. In the case shown in FIG. 3D, θ1 can be 1 deg, and θ2 can be 23 deg. While the embodiment shows the example, in which the angles θ1 and θ2 are determined as the angles where the easiness of cleavage is reduced by 10% from the easiness of cleavage at the off angle θ (which is 30 deg or 14 deg) as the standard value, the angles θ1 and θ2 can be determined based on the forces applied to the beveled portion in the process step of forming the beveled portion and the later steps. The forces applied to the beveled portion in the process step of forming the beveled portion and the later steps include the force applied to the beveled portion from the polishing pad, the force applied to be beveled portion in the transportation of the substrate, and the like. The angles θ1 and θ2 can be determined taking these forces into consideration.

Figure 9:
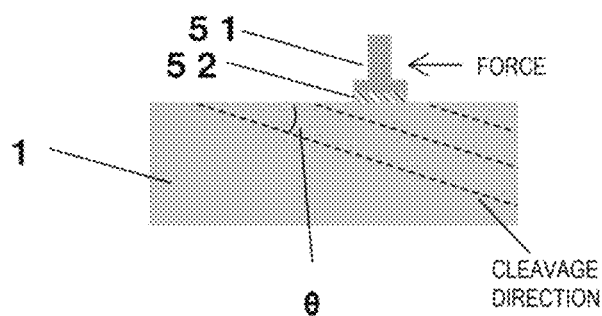
FIG. 9 is an illustration showing a method of measuring a shearing force of an $ScAlMgO_4$ substrate.
Figure 10:
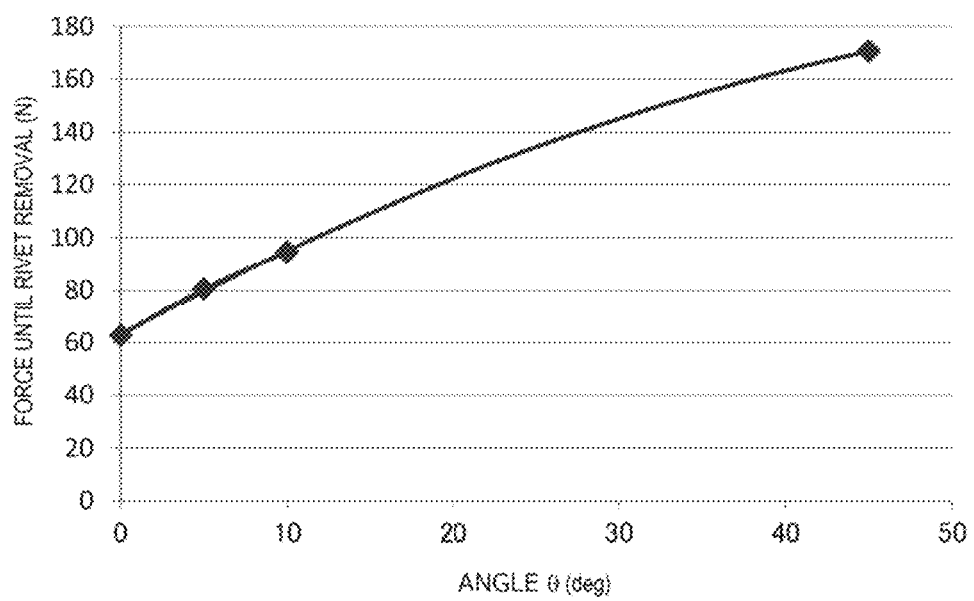
FIG. 10 is an illustration showing the relationship between the off angle and the shearing force of an $ScAlMgO_4$ substrate.

The relationship between the off angle θ and the easiness of cleavage is then described. The relationship between the off angle of the ScAlMgO$_4$ substrate 1 and the force applied to the principal surface of the ScAlMgO$_4$ substrate 1 in the horizontal direction (which may be hereinafter referred to as a "shearing force") is measured. As shown in FIG. 9, an aluminum rivet 51 having a diameter of 2 mm and a length of 4 mm is adhered to the ScAlMgO$_4$ substrate 1 with an adhesive 52 containing cyanoacrylate as a major component. A force is applied to the rivet in the direction in parallel to the principal surface of the ScAlMgO$_4$ substrate 1, and the force until the rivet is removed is measured for evaluating the easiness of cleavage of the ScAlMgO$_4$ substrate 1. FIG. 10 shows the measurement results for substrates having angles between the principal surface of the ScAlMgO$_4$ substrate 1 and the cleavage surface (i.e., off angles) θ of 0 deg, 5 deg, 10 deg, and 45 deg. As shown in FIG. 10, with a larger off angle θ, the force until the rivet is removed, i.e., the shearing force, is increased, and thus it can be said that the cleavage becomes difficult to occur with a larger off angle θ. The adhesive 52 used has a sufficiently strong adhesive force for preventing the rivet 51 from being released at the interface between the rivet 51 and the adhesive 52 or the interface between the adhesive 52 and the ScAlMgO$_4$ substrate 1.

As a result of the earnest investigations described above, the preferred relationship was determined among the off angle θ, the angle θ1 of the first region of the beveled portion, and the angle θ2 of the second region of the beveled portion. Specifically, it is particularly preferred that the off angle θ is 0.09 deg or more and 45 deg or less, the angle θ1 is more than 0 deg and less than θ deg, and the angle θ2 is more than θ and less than θ+45 deg.

Figure 11:
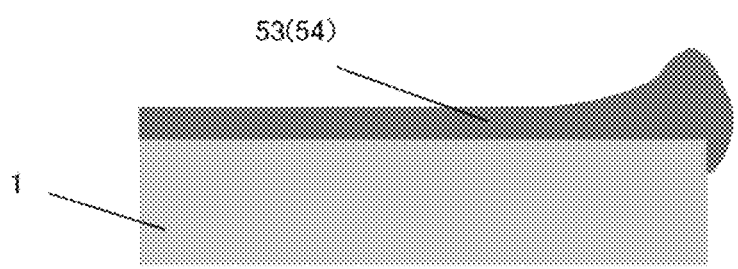
FIG. 11 is an illustration showing an edge crown.

In the case where epitaxial growth is performed by using an epitaxial growth surface of an ScAlMgO$_4$ substrate, a phenomenon referred to as an edge crown, in which an annular protrusion is formed on the peripheral portion of the epitaxial growth film 53 due to abnormal growth as shown in FIG. 11, may occur on a substrate having no beveled portion. Furthermore, on coating a photoresist, an abnormal accumulation may similarly occur in on the peripheral portion of the photoresist 54. The purposes of the formation of the beveled portion include not only the prevention of cleavage on application of an external force as described above, but also the prevention of the edge crown. Accordingly, in the case where the first region and the second region are provided in the beveled portion, the lengths of the regions in the direction in parallel to the principal surface of the ScAlMgO$_4$ substrate (i.e., the lengths shown by w1 and w2 in FIG. 1) are preferably determined in consideration of the influence of the edge crown. Specifically, the edge crown tends to have a low gradient on the side of the first region of the beveled portion, i.e., on the side of the inner peripheral portion of the ScAlMgO$_4$ substrate, whereas the edge crown tends to have a high gradient on the side of the second region of the beveled portion, i.e., on the side of the outer peripheral portion of the ScAlMgO$_4$ substrate. In consideration of this phenomenon, it is preferred to determine in such a manner that the angle θ2 formed between the second region of the beveled portion and the principal surface of the ScAlMgO$_4$ substrate is larger than the angle θ1 formed between the first region thereof and the principal surface of the ScAlMgO$_4$ substrate, as shown in FIG. 1. Furthermore, the length w1 of the first region in the direction in parallel to the principal surface of the ScAlMgO$_4$ substrate is preferably 0.1 mm or more and 5 mm or less, and the length w2 of the second region in the direction in parallel to the principal surface of the ScAlMgO$_4$ substrate is preferably 0.1 mm or more and 5 mm or less. The shape of the edge crown formed on the beveled portion may vary depending on the conditions of the epitaxial growth process or the conditions on coating the photoresist. Accordingly, any of the conditions w1<w2, w1=w2, and w1>w2 may be selected depending on the shape of the edge crown.

While the beveled portion having the inflection point A between the first region and the second region has been described above, the boundary portion between the epitaxial growth surface and the first region of the beveled portion or the boundary portion between the first region and the second region of the beveled portion may be subjected to polishing, grinding, or chamfering, so as to provide a shape where the surface and regions are smoothly connected.

The ScAlMgO$_4$ substrate may also have a beveled portion on the back surface (i.e., the surface opposite to the epitaxial growth surface). In this case, when the similar problem as in the front surface (i.e., the epitaxial growth surface) occurs, the shape of the beveled portion on the back surface may be the same as the shape of the beveled portion shown, in FIG. 1. The beveled portion formed on the back surface may effectively function not only for the prevention of chipping and cracking, but also for the discrimination of the front and back surfaces and the handling of the substrate with tweezers.

A method for forming the beveled portion having the aforementioned shape is then described. The beveled portion can be formed, for example, by a method of polishing with a rotating whetstone or a method of polishing with a polishing tape. In the bevel polishing method with a whetstone, a rotating whetstone is made in contact with a rotating wafer, and the altitude and angle of the wafer or the whetstone are changed depending on the bevel shape. The angle, the altitude, and the rotation number of the whetstone may be arbitrarily set with an NC (numerical control) device, which can be arbitrarily operated with a program, and thereby the beveled portion can be formed to have the intended shape. The bevel polishing device using a polishing tape may be constituted by a polishing head capable of controlling the pressure and the polishing angle of the polishing tape pressed onto the beveled portion of the wafer, and a feeding and rewinding mechanism for the polishing tape, and the angle of the polishing head can be arbitrarily programmed depending on the bevel shape. The bevel polishing device thus enables reliable polishing of beveled portions with various shapes to achieve the intended shapes. However, since the ScAlMgO$_4$ substrate has high cleavage property as described above, the beveled portion is preferably formed by the same method as for the epitaxial growth surface, i.e., the special processing method of the embodiment.

Embodiment 2

Figure 4:
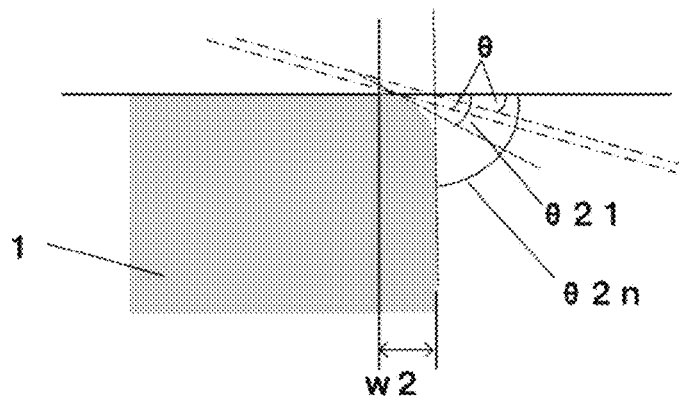
FIG. 4 is a cross sectional view showing the beveled portion in the embodiment 2.
Figure 5:
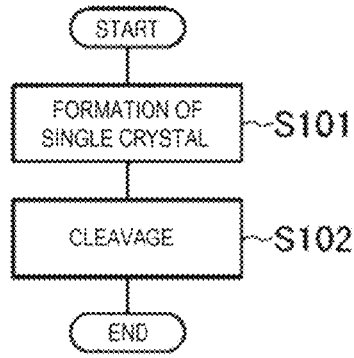
FIG. 5 is a diagram showing an example of the method for producing an ordinary $ScAlMgO_4$ substrate.

FIG. 4 shows a beveled portion of an ScAlMgO$_4$ substrate of an embodiment 2. In the beveled portion of the ScAlMgO$_4$ substrate 1 of the embodiment 2, the region having an angle formed between the principal surface of the ScAlMgO$_4$ substrate 1 and the surface thereof that is smaller than the off angle θ, i.e., the region corresponding to the first region of the embodiment 1, is present in an extremely short length or is approximately not present, and the beveled portion mainly contains the region having an angle formed between the principal surface of the ScAlMgO$_4$ substrate 1 and the surface thereof that is larger than the off angle θ, i.e., the region corresponding to the second region of the embodiment 1. In the beveled portion, the angle formed between the surface thereof and the principal surface of the ScAlMgO$_4$ substrate 1 is set to be increased from θ21 to θ2n. Specifically, the angle formed between the surface of the beveled portion and the principal surface of the ScAlMgO$_4$ substrate 1 is changed in a stepwise manner. The number n in θ2n is the number of changes of the angle formed between the surface of the beveled portion and the principal surface of the ScAlMgO$_4$ substrate 1, which is a natural number of 2 or more set in the formation of the beveled portion, and the beveled portion may have a smoother shape with the increase of the number n.

While the embodiment 2 describes that the region corresponding to the second region of the embodiment 1 has two or more angles, the region corresponding to the first region of the embodiment 1 may be set to have two or more angles. In these regions, furthermore, the boundary portions where the angle is changed may be subjected to polishing, grinding, or chamfering to provide a shape where the regions are smoothly connected.

Other Embodiments

While the embodiments 1 and 2 describe the substrate obtained from a ScAlMgO$_4$ single crystal as a substrate formed of a single crystal represented by the general formula RAMO$_4$, the embodiments are not limited thereto. Specifically, the substrate of the embodiments is constituted by a substantially sole crystal material represented by the general formula RAMO$_4$. In the general formula, R represents one or a plurality of trivalent elements selected from Sc, In, Y, and a lanthanoid element (atomic number: 67 to 71), A represents one or a plurality of trivalent elements selected from Fe(III), Ga, and Al, and M represents one or a plurality of divalent elements selected from Mg, Mn, Fe(II), Co, Cu, Zn, and Cd. The substantially sole crystal material means a crystalline solid, in which the material contains 90% by atom or more of the RAMgO$_4$ constituting the epitaxial growth surface, and in terms of an arbitrary crystal axis, the direction of the crystal axis is not changed in any part on the epitaxial growth surface. However, a material having a crystal axis that is locally changed in direction thereof and a material containing local lattice defects are handled as a single crystal. O represents oxygen. As described above, it is particularly preferred that R is Sc, A is Al, and M is Mg.

In the production of an LED device by growing an LED light emitting layer on a substrate by MOCVD vapor phase epitaxial growth, the use of the substrate of the embodiments can suppress light emission unevenness and further can prevent reduction in luminance of the LED device, while enhancing the production, yield.

What is claimed is:

1. A RAMO$_4$ substrate comprising a RAMO$_4$ base material part containing a single crystal represented by the general formula RAMO$_4$, where R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd, wherein:

the RAMO$_4$ base material part has a beveled portion at an edge portion of the RAMO$_4$ base material part, the RAMO$_4$ base material part has a principal surface having an off angle θ with respect to a cleavage surface of the single crystal, the beveled portion contains a first region having an angle θ1 with respect to the principal surface, and a second region formed outside the first region, having an angle θ2 with respect to the principal surface, and the angles θ, θ1, and θ2 satisfy the relationship θ1<θ<θ2.

2. The RAMO$_4$ substrate according to claim 1, wherein the off angle θ satisfies 0.09 deg≤θ≤45 deg, and the angles θ and θ2 satisfy θ2<θ+45 deg.

3. The RAMO$_4$ substrate according to claim 1, wherein assuming that w1 shows a length of the first region in a direction in parallel to the principal surface, and w2 shows a length of the second region in a direction in parallel to the principal surface, w1 is at least 0.1 mm and no greater than 5 mm, and w2 is at least 0.1 mm and no greater than 5 mm.

4. The RAMO$_4$ substrate according to claim 1, wherein the principal surface does not have irregularities of 500 nm or more.

5. The RAMO$_4$ substrate according to claim 1, wherein the single crystal contains ScAlMgO$_4$.

* * * * *